United States Patent
Yamaguchi et al.

(10) Patent No.: US 11,148,217 B2
(45) Date of Patent: Oct. 19, 2021

(54) REFLOW FURNACE AND SOLDERING METHOD

(71) Applicant: Panasonic Intellectual Property Management Co., Ltd., Osaka (JP)

(72) Inventors: Naoshi Yamaguchi, Osaka (JP); Toshiro Kanda, Kyoto (JP); Yasuyuki Takano, Fukuoka (JP); Koichi Nagai, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 119 days.

(21) Appl. No.: 16/275,218

(22) Filed: Feb. 13, 2019

(65) Prior Publication Data

US 2020/0001386 A1    Jan. 2, 2020

(30) Foreign Application Priority Data

Jun. 27, 2018  (JP) .............................. JP2018-122315

(51) Int. Cl.
  *B23K 3/00*  (2006.01)
  *B23K 3/08*  (2006.01)
  (Continued)

(52) U.S. Cl.
  CPC .............. *B23K 3/085* (2013.01); *B23K 1/008* (2013.01); *B23K 3/082* (2013.01); *H05K 3/3494* (2013.01);
  (Continued)

(58) Field of Classification Search
  CPC .................... B23K 3/085; B23K 1/008; B23K 2101/36–42; B23K 3/0478;
  (Continued)

(56) References Cited

U.S. PATENT DOCUMENTS 3,997,317 A * 12/1976 Dicks ..................... C03B 25/06
                                                        65/350
4,742,950 A *  5/1988 Neitz ..................... B23K 1/008
                                                        228/234.1
(Continued)

FOREIGN PATENT DOCUMENTS

JP        03221783 A  *  9/1991
JP        05050219 A  *  3/1993
(Continued)

OTHER PUBLICATIONS

Machine translation of JP-2008078510-A (no date available).*
Machine translation of JP-2008124112-A (no date available).*

*Primary Examiner* — Kiley S Stoner
(74) *Attorney, Agent, or Firm* — Wenderoth, Lind & Ponack, L.L.P.

(57) ABSTRACT

A reflow furnace that can reduce both the flux clinging defect in a circuit board, and the thermal cracking defect in an electronic component has a heat zone in which a circuit board with a mounted electronic component is heated, and a cooling zone in which the heated circuit board is cooled, and includes: a shield disposed between the heat zone and the cooling zone and having an opening for passage of the circuit board; and a tunnel-like cover physically coupled to the opening and extending along a transport direction of the circuit board.

17 Claims, 13 Drawing Sheets

(51) Int. Cl.
*B23K 1/008* (2006.01)
*H05K 3/34* (2006.01)
*B23K 101/42* (2006.01)

(52) U.S. Cl.
CPC .... *B23K 2101/42* (2018.08); *H05K 2203/081* (2013.01)

(58) Field of Classification Search
CPC ............ B23K 1/0016; B23K 1/00–206; B23K 3/00–087; H05K 3/3494; H05K 2203/081; H05K 1/0271
USPC ................ 228/9, 42–43, 59, 233.2, 218–220
See application file for complete search history.

(56) References Cited

U.S. PATENT DOCUMENTS

| | | | | |
|---|---|---|---|---|
| 5,044,944 A | * | 9/1991 | Furuya | F27B 9/028 432/128 |
| 5,322,209 A | * | 6/1994 | Barten | B23K 1/008 228/183 |
| 5,427,305 A | * | 6/1995 | Nishimura | B23K 1/00 228/233.2 |
| 5,443,382 A | * | 8/1995 | Tsurumi | F27B 9/028 432/128 |
| 5,490,704 A | * | 2/1996 | Calnan | B60P 3/14 280/764.1 |
| 6,039,236 A | * | 3/2000 | Dopper | B23K 1/012 228/46 |
| 6,382,500 B1 | * | 5/2002 | Master | B23K 1/0016 228/180.1 |
| 6,386,422 B1 | * | 5/2002 | Cheng | B23K 1/008 228/46 |
| 8,776,773 B1 | * | 7/2014 | Wolfe | A21B 1/245 126/21 A |
| 9,302,605 B1 | * | 4/2016 | Van Pelt | B60P 3/38 |
| 2003/0111459 A1 | * | 6/2003 | Nishimura | B23K 1/012 219/615 |
| 2003/0224555 A1 | * | 12/2003 | Shiozawa | H01L 21/6835 438/108 |
| 2008/0006294 A1 | * | 1/2008 | Saxena | B23K 3/085 134/2 |
| 2009/0134142 A1 | * | 5/2009 | Nakamura | F27B 9/36 219/420 |
| 2013/0062399 A1 | * | 3/2013 | McQuirk | B23K 1/203 228/262.51 |
| 2013/0119112 A1 | * | 5/2013 | Sukekawa | B23K 3/08 228/42 |
| 2017/0203377 A1 | * | 7/2017 | Yokoyama | H01L 21/67103 |
| 2019/0234342 A1 | * | 8/2019 | Saito | F02G 1/04 |
| 2019/0388991 A1 | * | 12/2019 | Yamaguchi | B03C 3/41 |

FOREIGN PATENT DOCUMENTS

| | | | |
|---|---|---|---|
| JP | 3226651 B2 | * | 11/2001 |
| JP | 2008078510 A | * | 4/2008 |
| JP | 2008124112 A | * | 5/2008 |
| JP | 2018-069290 | | 5/2018 |
| JP | 6336707 B2 | * | 6/2018 |

* cited by examiner

REFLOW FURNACE AND SOLDERING METHOD

TECHNICAL FIELD

The present disclosure relates to a reflow furnace and a soldering method for soldering.

BACKGROUND

Mounting of an electronic component on a circuit board typically includes the step of applying a solder paste to predetermined locations of the circuit board, and mounting the electronic component on the solder paste, and the step of melting the solder paste underneath the electronic component mounted on the circuit board, and solidifying the solder paste to electrically join the electronic component to the circuit board.

The latter step is a soldering step, and typically uses a reflow furnace. For soldering, a circuit board is carried into a reflow furnace with a conveyer, and passed through a preheat zone, a heat zone, and a cooling zone in succession according to the predetermined temperature profile.

Soldering using a reflow furnace has some drawbacks, including, for example, a flux clinging defect.

In the heat zone, the flux components of the solder paste applied to a circuit board vaporize as the solder paste is exposed to high temperature. These flux components evaporate in the reflow furnace in the form of flux particles. The flux particles cool as the atmosphere gas containing the flux particles moves into the cooling zone from the heat zone, and the flux particles condense in many parts of the cooling zone. Specifically, when the inner walls or the ceiling of the furnace in the cooling zone have the flux particles clinging to the surface in large quantity, a flux clinging defect may occur as a result of the deposited flux falling on the traveling circuit board, and stain the circuit board.

Various reflow furnaces are proposed that are intended to overcome the problems caused by clinging of a solid or sticky material of flux component origin. For example, JP-A-2018-69290 proposes a reflow furnace in which a cooling-gas blow unit for blowing a gas against a circuit board is installed between a heat zone and a cooling zone. The cooling gas from the blow unit inhibits the flux particles from moving into the cooling zone from the heat zone. In this way, the related art is intended to reduce the amount of flux clinging to the inner walls or the ceiling surface of the furnace in the cooling zone, and to thereby reduce the flux clinging defect.

However, the last years have seen increasing cases of heat intolerant electronic components, such as image sensors, display devices, and light-emitting devices being mounted on a circuit board. Because these heat intolerant electronic components are susceptible to thermal changes, the electronic component itself becomes thermally deformed and cracks when the circuit board is rapidly cooled in the cooling zone using the traditional temperature profile in mounting the electronic component on the circuit board. Indeed, such a thermal cracking defect has become commonplace.

In the structure of the foregoing related art in which the blow unit is provided between the heat zone and the cooling zone, and a cooling gas is blown against a circuit board, the circuit board is inevitably cooled at a rapid rate between the heat zone and the cooling zone, and, though the technique may be able to successfully reduce the flux clinging defect, the rate of thermal cracking defect increases.

While the configuration of the related art can reduce the flux clinging defect, the related art cannot reduce the thermal cracking defect but instead increases the thermal cracking defect when the cooling gas has an overly high flow rate or an excessively low temperature.

SUMMARY

The present disclosure is intended to provide a solution to the foregoing problems of the related art, and it is an object of the present disclosure to provide a reflow furnace and a soldering method that can reduce both the flux clinging defect in a circuit board, and the thermal cracking defect in electronic components.

According to an aspect of the present disclosure, there is provided a reflow furnace that has a heat zone in which a circuit board with a mounted electronic component is heated, and a cooling zone in which the heated circuit board is cooled, the reflow furnace including:
a shield disposed between the heat zone and the cooling zone and having an opening for passage of the circuit board; and
a tunnel-like cover coupled to the opening and extending along a transport direction of the circuit board.

According to another aspect of the present disclosure, there is provided a soldering method that includes:
heating an electronic component-mounted circuit board in a heat zone; and
cooling the heated circuit board in a cooling zone,
wherein the heat zone and the cooling zone are spatially separated from each other by a shield having an opening, and
wherein the heated circuit board is carried into the cooling zone from the heat zone through a tunnel-like cover physically coupled to the opening.

With the configurations of the aspects of the present disclosure, a reflow furnace and a soldering method can be provided that can reduce both the flux clinging defect in a circuit board, and the thermal cracking defect in electronic components.

DESCRIPTION OF EMBODIMENTS

Figure 12:
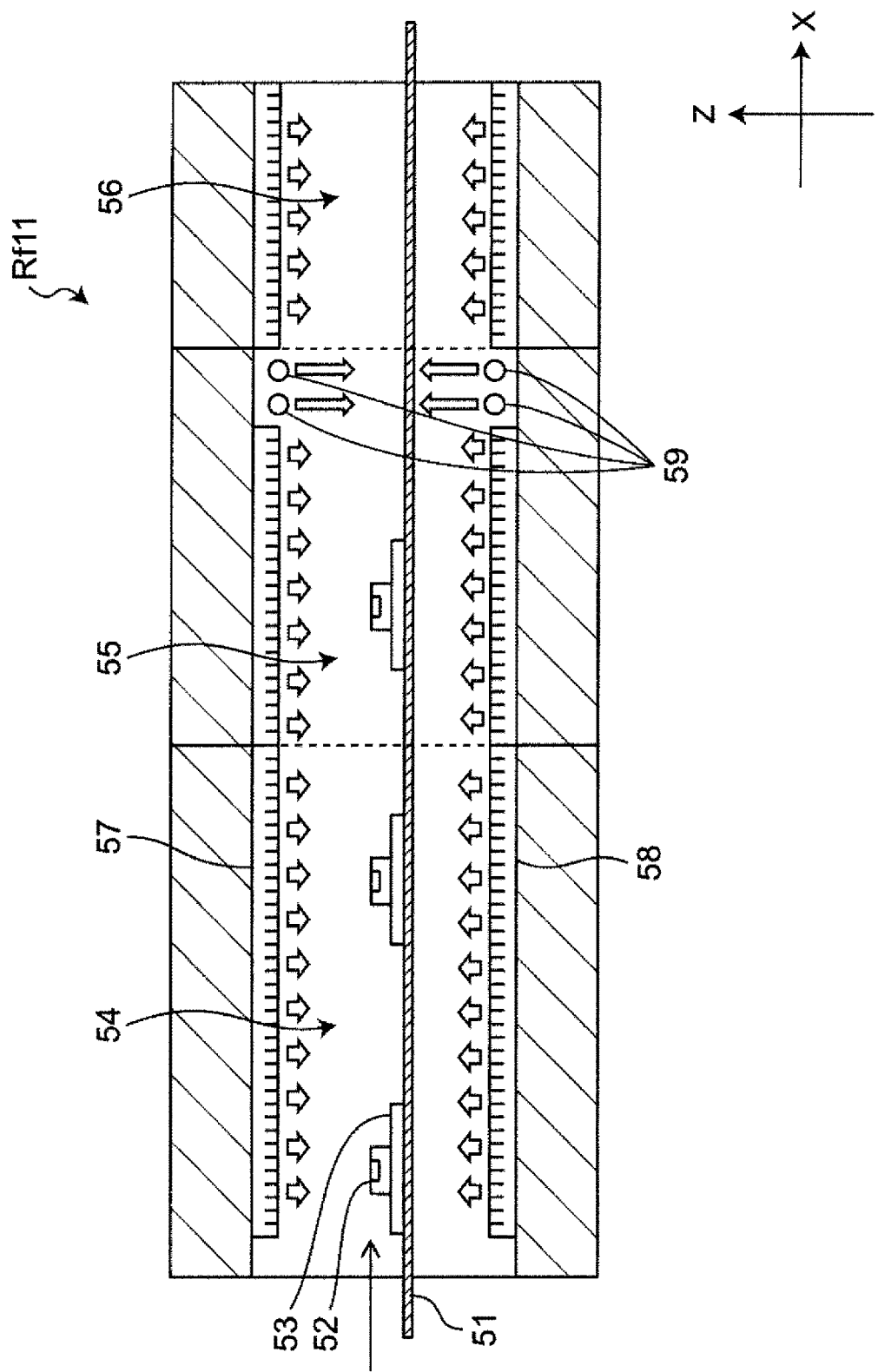
FIG. 12 is a longitudinal sectional view of a reflow furnace of related art.

The problems with the reflow furnace and the soldering method of the related art are described below in detail, with reference to FIGS. 12 and 13. FIG. 12 is a cross sectional view showing a reflow furnace Rf11 described in JP-A-2018-69290, as viewed on a plane parallel to the transport direction of a circuit board. In the reflow furnace Rf11, a circuit board 53 with an electronic component 52 mounted thereon is carried into the furnace through a circuit board entrance with a conveyer 51, and subjected to a soldering process through a preheat zone 54, a heat zone 55, and a cooling zone 56.

Figure 13:
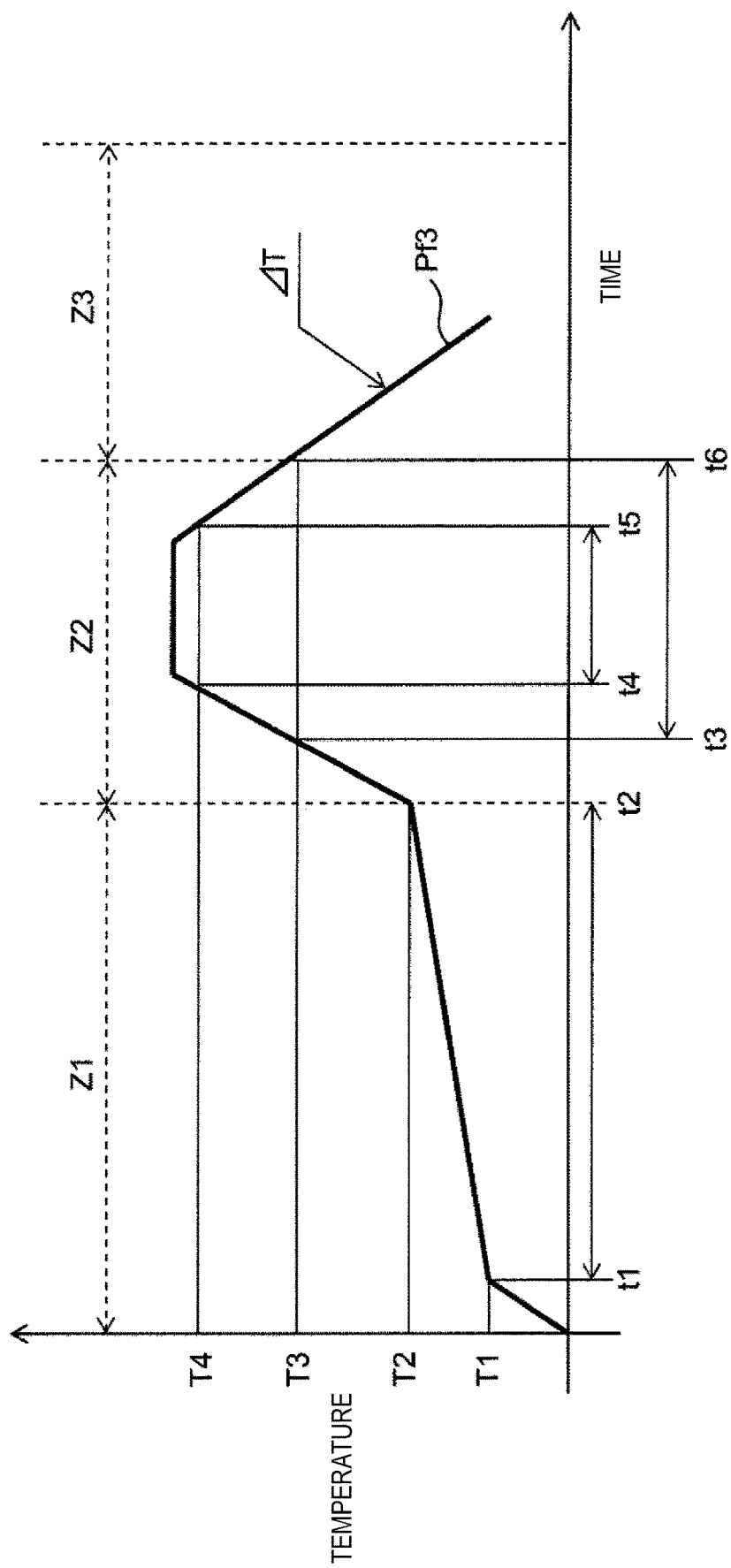
FIG. 13 is a graph representing the temperature profile of the reflow furnace of related art.

FIG. 13 is a graph representing a typical temperature profile Pf3 of the circuit board. The temperature profile Pf3 is set so that the circuit board 53 in the transport zone Z1 (preheat zone 54) has a temperature of T1 to T2 for a pass time of (t2−t1). In the transport zone Z2 (heat zone 55), the temperature of the circuit board 53 is T3 or more for a pass time of (t6−t3), and T4 or more for a pass time of (t5−t4). For the transport zone Z3 (cooling zone 56), the temperature profile Pf3 is set according to such conditions as the type of solder paste, and the type of electronic circuit board (the cooling rate has ΔT per unit time). A high-quality soldering process is possible when these conditions are satisfied.

To avoid a thermal cracking defect, the cooling zone 56 must have a low cooling rate, that is, gradual cooling is needed. However, decreasing the cooling rate of the cooling zone 56 increases the amount of flux particle-containing atmosphere gas moving into the cooling zone 56 from the heat zone 55. This increases the amount of flux clinging to the inner walls or the ceiling plate surface of the furnace in the cooling zone 56, and increases the flux clinging defect. That is, there is a trade-off between thermal cracking defect and flux clinging defect.

In the disclosure of the related art above, a blow unit 59 is provided between the heat zone 55 and the cooling zone 56 to blow a cooling gas against the circuit board 53. The blow unit 59 is configured from a plurality of pores formed in the side surface of a pipe. With this structure, the cooling gas inhibits movement of flux particles into the cooling zone 56 from the heat zone 55 where the flux particles are generated. In this way, the related art can reduce the amount of flux clinging to the walls or the ceiling surface of the furnace in the cooling zone 56, and reduce the flux clinging defect.

In a different embodiment of the related art, the blow unit 59 blows a high-temperature gas against the circuit board 53, instead of the cooling gas. However, the circuit board 53 is still rapidly cooled in the cooling zone 56 after passing through the region where the circuit board 53 is subjected to a high-temperature gas on the conveyer 51. Accordingly, the related art fails to overcome the thermal cracking defect.

First Embodiment

Embodiments of the present disclosure are described below, with reference to the accompanying drawings. The present disclosure is not limited to the embodiments described below. It is also to be noted that various changes may be made as appropriate, provided that such changes fall within the range providing the effects of the present disclosure. A combination of different embodiments is also possible. In the drawings, the X-axis, Y-axis, and Z-axis represent directions along the length, width, and height, respectively, of reflow furnace Rf1.

Figure 1:
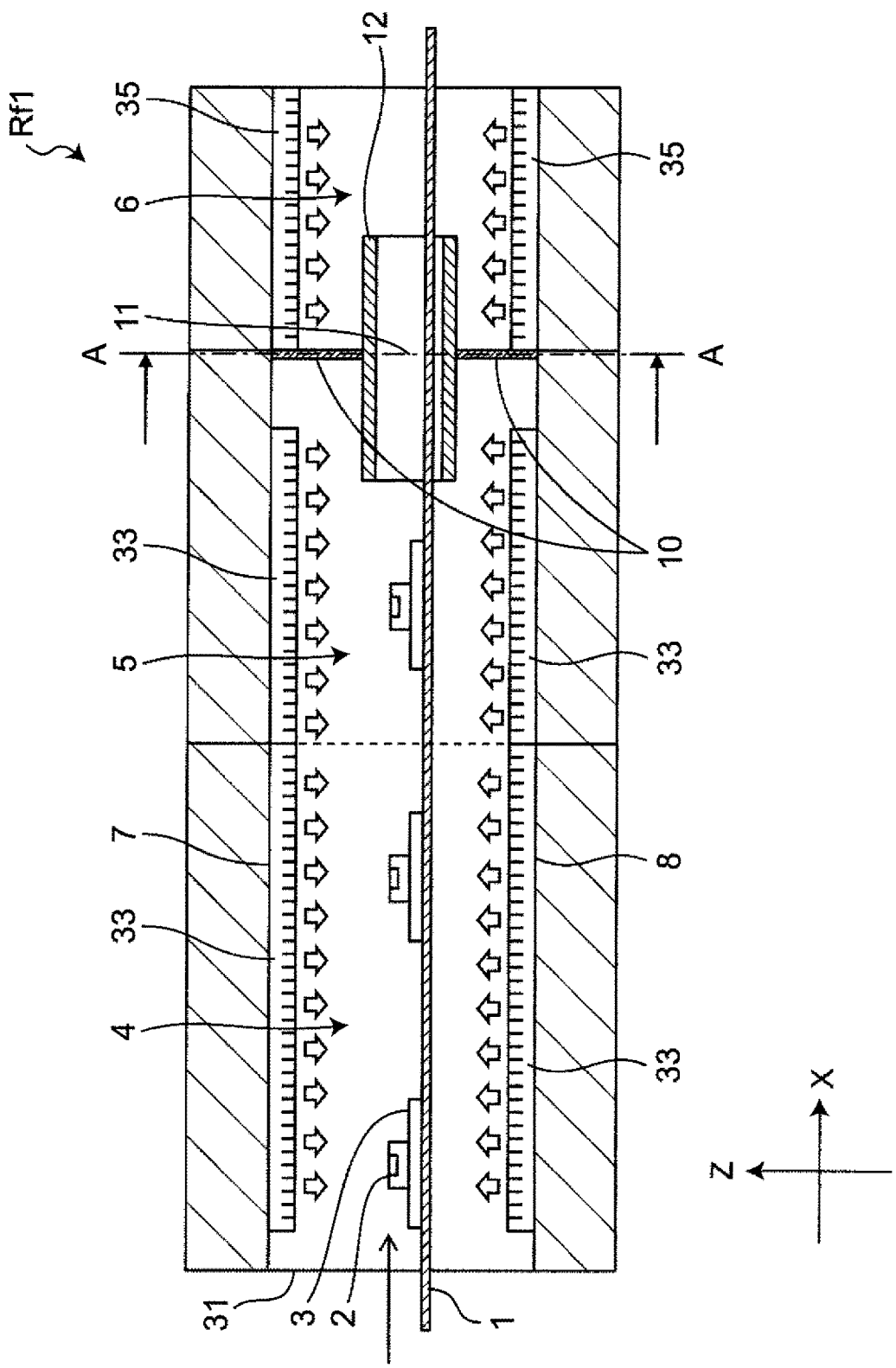
FIG. 1 is a longitudinal sectional view of a reflow furnace of First Embodiment.
Figure 2:
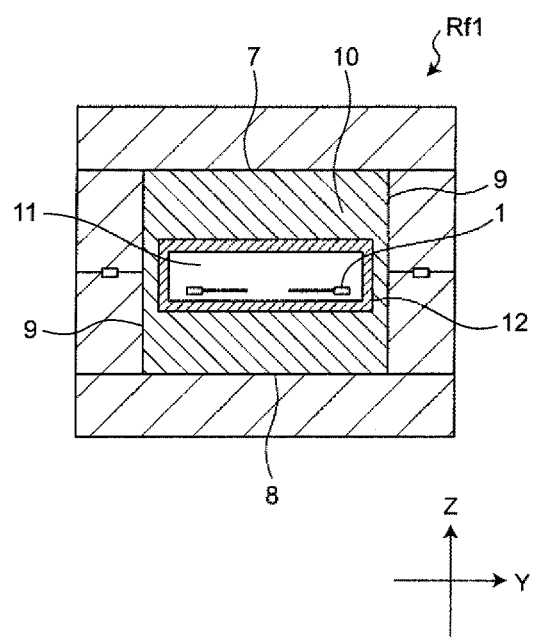
FIG. 2 is a cross sectional view of the reflow furnace at line A-A of FIG. 1.

FIG. 1 is a cross sectional view of a reflow furnace Rf1 of First Embodiment of the present disclosure, as viewed on a plane parallel to the transport direction of a circuit board 3. FIG. 2 is a cross sectional view at A-A of FIG. 1, as viewed in the direction of arrow. In the reflow furnace Rf1, a circuit board 3 with an electronic component 2 mounted thereon is carried into the furnace Rf1 through an entrance 31 with a conveyer 1 in a longitudinal direction (X direction). The electronic component 2 and the circuit board 3 are subjected to a soldering process through a preheat zone 4, a heat zone 5, and a cooling zone 6 provided in the reflow furnace Rf1.

The preheat zone 4 represents a step in which volatiles, mainly solvent, in the solder paste vaporize, and in which the atmosphere gas in the furnace has a temperature of about 150° C. to 200° C. The heat zone 5 represents a step in which vaporization of the flux components of the solder paste mainly takes place, and that melts the solder powder. The atmosphere gas in the heat zone 5 has a temperature of about 200° C. to 250° C. The cooling zone 6 represents a step that solidifies the solder, and cools the circuit board 3 itself at a rate of about 6° C./s.

The temperature profile of the circuit board 3 is a set of carefully set conditions (for example, heating time, maximum temperature retention time, and cooling rate) for soldering of the circuit board 3 using the reflow furnace Rf1. Different temperature profiles are set for different conditions, which include, for example, the type of the solder paste used, the type of mounted electronic component 2, and the area of the circuit board 3. The reflow furnace Rf1 carries out the soldering process according to the temperature profile.

In order to achieve such temperature profiles, the reflow furnace Rf1 is structured to include a plurality of heaters 33 in the upper and lower parts of the preheat zone 4 and the heat zone 5 so as to blow temperature-controlled hot air from a ceiling plate 7 and a bottom plate 8. The cooling zone 6 is structured to include a cooler 35 or a fan so as to blow cool air or ordinary-temperature air from the ceiling plate 7 and the bottom plate 8. The conveyer 1 is configured as a mesh conveyer, allowing the atmosphere gas in the furnace to vertically pass through the conveyer 1.

In the reflow furnace Rf1 of First Embodiment of the present disclosure, a shield 10 is installed that spatially separates the heat zone 5 and the cooling zone 6 from each other, and that has an opening 11 for passage of the circuit board 3. The shield 10 is disposed between the heat zone 5 and the cooling zone 6. Vertically, the shield 10 extends to the ceiling plate 7 and the bottom plate 8 above and below the passageway of the circuit board 3. Horizontally, the shield 10 extends to the side surface portions of the reflow furnace Rf1, spatially separating the heat zone 5 and the cooling zone 6 from each other. Here, the opening 11 is the only entry point to the cooling zone 6 from the heat zone 5.

The opening 11 is provided through a central portion of the shield 10 made of metal. The conveyer 1 travels through the opening 11, and, accordingly, the circuit board 3 with the mounted electronic component 2 is able to pass through the shield 10. A tunnel-like cover 12, extending in both ways, forward and reverse, along transport direction (X direction) is coupled to the opening 11. The tunnel-like cover 12 shown in the figure has a shape of a hollow rectangular column. Aside from this, the tunnel-like cover 12 may be, for example, a rectangular cover of a shape configured from at least two side surfaces and one top surface, as viewed on a cross section perpendicular to the transport direction of the circuit board 3, or may be a circular or an arc-shaped cover. That is, the tunnel-like cover 12 may have a shape with an open bottom.

With the configuration of First Embodiment, the shield 10 acts to block the movement of the flux particle-containing atmosphere gas into the cooling zone 6 from the heat zone 5 in portions other than the opening 11. Further, the opening 11 provides only a small area of passage for the circuit board 3, and the conductance of the traveling gas becomes smaller by the provision of the tunnel-like cover 12. In this way, the flux particle-containing atmosphere gas in the furnace can be prevented from entering the cooling zone 6 from the heat zone 5. Here, the atmosphere gas becomes less likely to flow into the opening 11 as the aperture size of the opening 11 and the tunnel-like cover 12 becomes smaller. However, the aperture size needs to be large enough to allow for passage of the circuit board 3 with the electronic component 2 mounted thereon.

The shield 10 may be absent in a portion between the tunnel-like cover 12 and the bottom plate 8 at the bottom of the furnace when the shield 10 cannot be installed in this portion of the furnace because of limitations posed by, for example, the height of the circuit board 3 with the mounted electronic component 2, and a small distance from the conveyer 1 to the bottom plate 8 at the bottom of the furnace, provided that the concentration of the flux particles in the atmosphere gas is relatively small.

Figure 3:
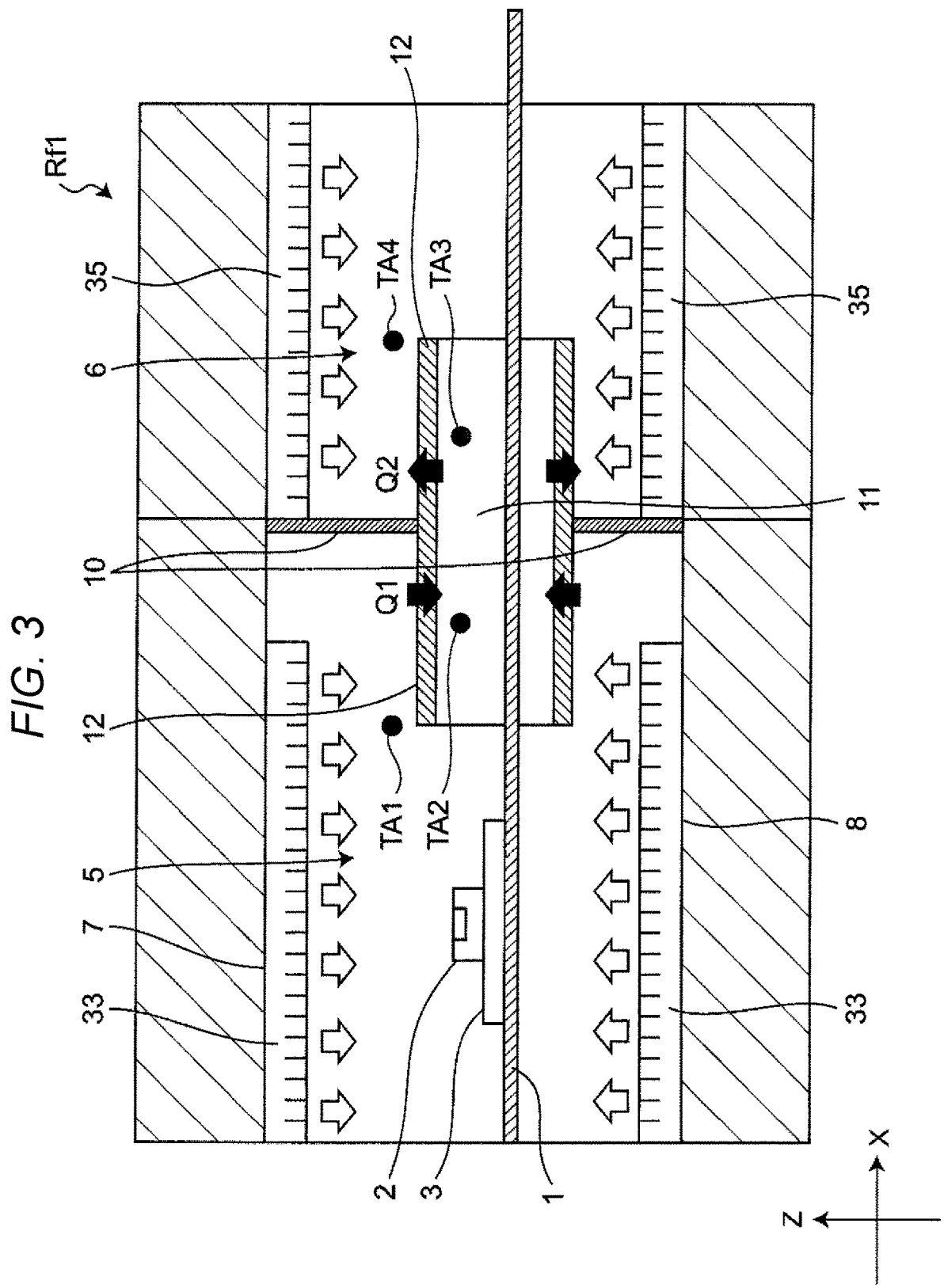
FIG. 3 is a partially enlarged longitudinal sectional view showing areas around a tunnel-like cover shown in FIG. 1.

FIG. 3 is an enlarged view of the heat zone 5 and the cooling zone 6 shown in FIG. 1 of First Embodiment of the present disclosure. TA1, TA2, TA3, and TA4 in FIG. 3 represent measurement points of ambient temperature in the furnace. The measurement points TA1 and TA4 are set at the end portions of the tunnel-like cover 12 in the heat zone 5 and the cooling zone 6, respectively, along a direction parallel to the transport direction of the circuit board 3, and these measurement points are at the same level in a direction perpendicular to the transport direction of the circuit board 3. At the measurement points TA1 and TA4, the representative temperatures of the heat zone 5 and the cooling zone 6 can be measured. The measurement points TA2 and TA3 are set inside of the tunnel-like cover 12, and are symmetrical and equidistant from the shield 10 along a direction parallel to the transport direction of the circuit board 3. These measurement points are at the same level in a direction perpendicular to the transport direction of the circuit board 3. At the measurement points TA2 and TA3, the representative temperatures inside the tunnel-like cover 12 can be measured for the heat zone 5 and the cooling zone 6, respectively.

The ambient temperatures detected at the measurement points TA1, TA2, TA3, and TA4 in the furnace are represented by TP1, TP2, TP3, and TP4, respectively.

The atmosphere gas in the reflow furnace Rf1 remains almost static in the tunnel-like cover 12. In this state, the top surface, the bottom surface, and the side surfaces of the tunnel-like cover 12 on the heat zone 5 side of the shield 10 are heated by the atmosphere of the heat zone 5 by means of convection and radiation. That is, inside of the tunnel-like cover 12 is heated by the transfer of heat Q1 through the top, bottom, and side walls of the tunnel-like cover 12. In the tunnel-like cover 12 on the cooling zone 6 side of the shield 10, heat Q2 dissipates into the atmosphere of the cooling zone 6 through the top, bottom, and side walls. Because transfer of heat takes place in this fashion, the following relationship can be established:

$$TP1 > TP2 > TP3 > TP4, \quad \text{Formula 1}$$

where TP1 is the ambient temperature of the heat zone 5, TP2 is the ambient temperature in the tunnel-like cover 12 on the heat zone 5 side of the shield 10, TP3 is the ambient temperature in the tunnel-like cover 12 on the cooling zone 6 side of the shield 10, and TP4 is the ambient temperature of the cooling zone 6.

Figure 4:
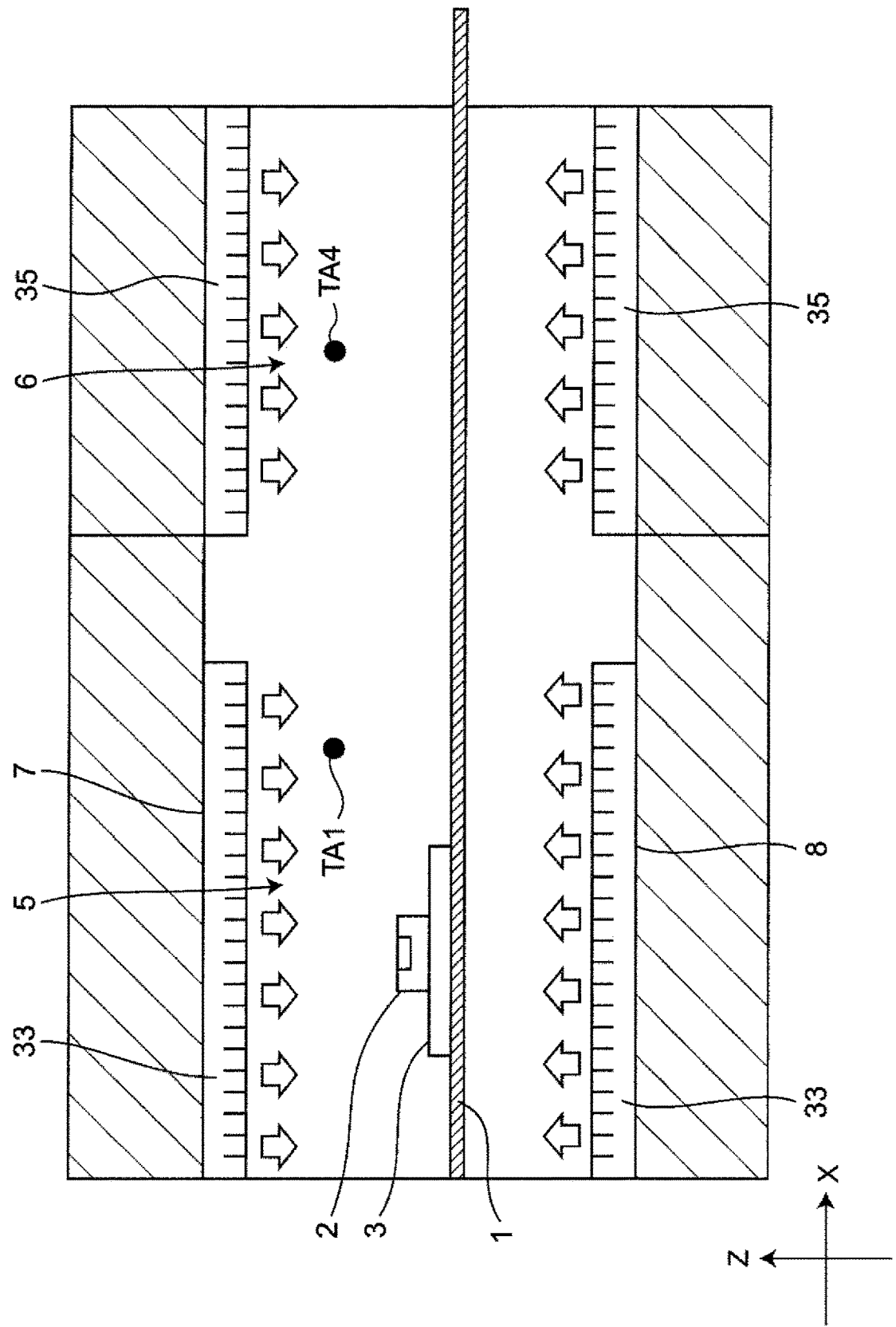
FIG. 4 is a partially enlarged longitudinal sectional view of a reflow furnace lacking the configuration of the First Embodiment.
Figure 5:
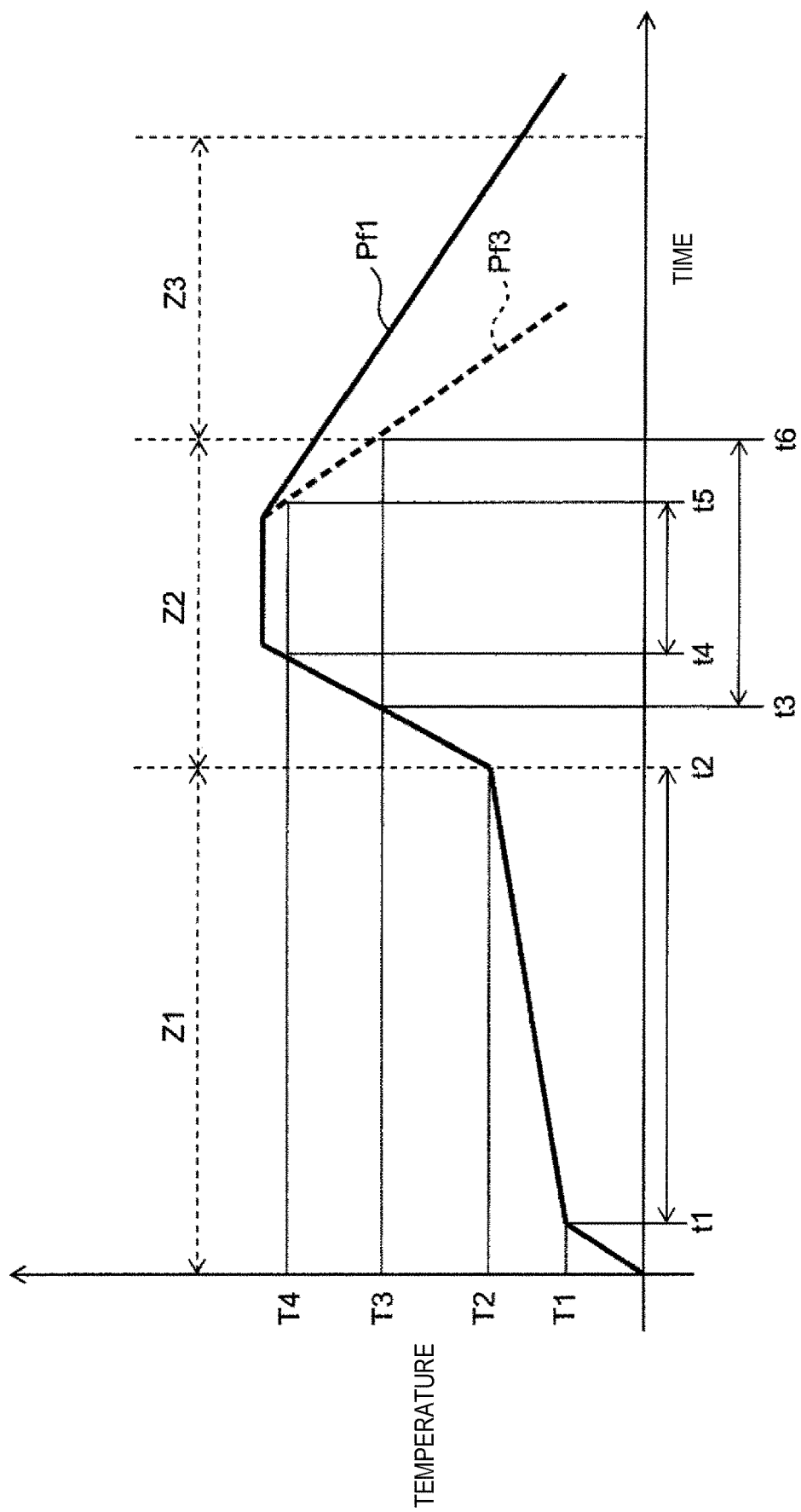
FIG. 5 shows a graph representing the temperature profile of the reflow furnace of First Embodiment.

FIG. 4 is an enlarged view of the heat zone 5 and the cooling zone 6 in a reflow furnace of a configuration in which the shield 10 and the tunnel-like cover 12 of the present disclosure are absent between the heat zone 5 and the cooling zone 6. FIG. 5 shows the temperature profile Pf1 of the reflow furnace Rf1 of First Embodiment of the present disclosure, and the temperature profile Pf3 of the reflow furnace of a configuration in which the shield 10 and the tunnel-like cover 12 of the present disclosure are absent between the heat zone 5 and the cooling zone 6. Specifically, in a part of the graph representing the cooling rate in the cooling zone 6, the temperature profile Pf1 of First Embodiment of the present disclosure is represented by solid line, and the temperature profile Pf3 representing the cooling rate without the structure of the present disclosure is represented by dotted line. In FIG. 5, the elements described in conjunction with FIG. 13 are referred to using the same reference numerals, and will not be described again.

In FIG. 4, the ambient temperature TP1 of the heat zone 5, and the ambient temperature TP4 of the cooling zone 6 are directly adjacent to each other within a space, and the incoming circuit board 3 is exposed to the ambient temperature TP4 in the atmosphere of the cooling zone 6 immediately after being exposed to the ambient temperature TP1 in the atmosphere of the heat zone 5. Accordingly, the temperature profile representing the cooling rate has a slope such as that indicated by dotted line in FIG. 5, meaning that the circuit board 3 is rapidly cooled.

In the reflow furnace Rf1 of the configuration of the present disclosure in which the shield 10 and the tunnel-like cover 12 are provided between the heat zone 5 and the cooling zone 6, the circuit board 3 is exposed to the atmosphere of gradually decreasing temperatures according to the relationship represented by formula 1. Accordingly, the circuit board 3 experiences smaller temperature changes, and the temperature profile Pf1 representing the cooling rate has a gradual slope such as that indicated by solid line in FIG. 4, preventing rapid cooling of the circuit board 3. That is, the cooling zone 6 has a lower cooling rate, and thermal cracking defect can be reduced in the electronic component 2.

Figure 6:
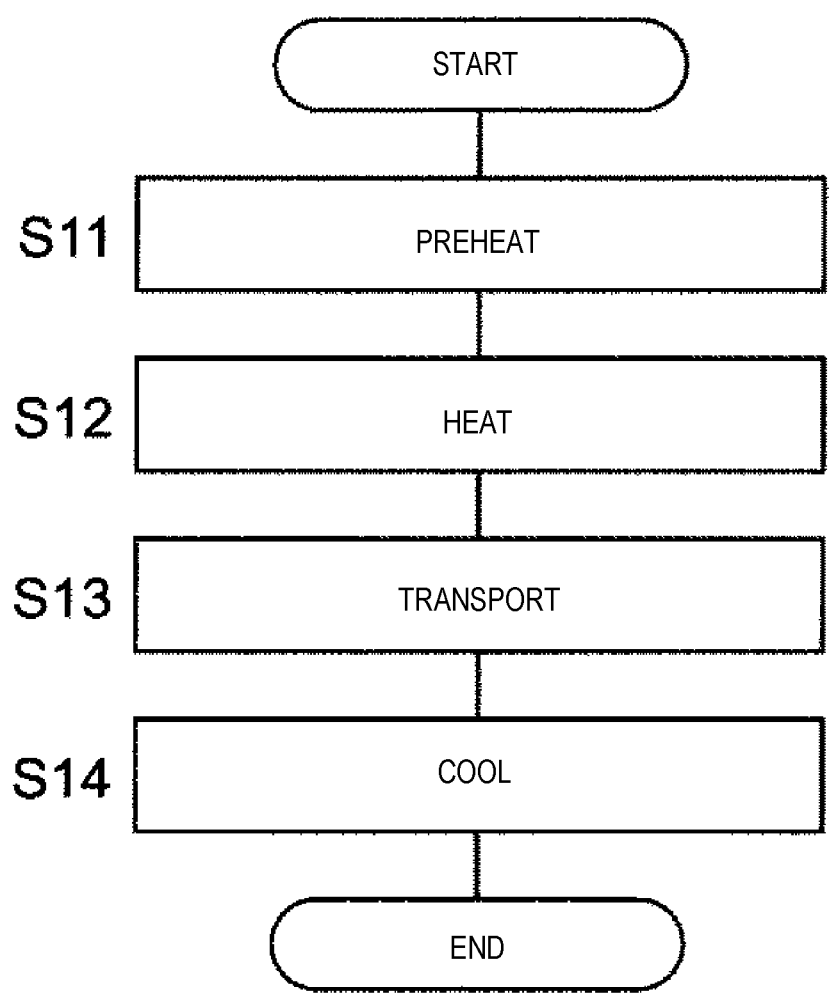
FIG. 6 is a flowchart representing a soldering procedure of First Embodiment.

FIG. 6 is a flowchart representing a procedure of the soldering method of the First Embodiment. First, the circuit board 3 is carried into the reflow furnace Rf1 with the conveyer 1. In step S11, the circuit board 3 with the mounted electronic component 2 is preheated in the preheat zone 4. In step S12, the circuit board 3 with the mounted electronic component 2 is heated in the heat zone 5. In step S13, the heated circuit board 3 is carried into the cooling zone 6 from the heat zone 5 by the conveyer 1 through the tunnel-like cover 12 physically coupled to the opening 11 provided through the shield 10 spatially separating the heat zone 5 and the cooling zone 6 from each other. In step S14, the heated circuit board 3 is cooled in the cooling zone 6.

As described above, the reflow furnace Rf1 according to First Embodiment has the heat zone 5 in which the circuit board 3 with the mounted electronic component 2 is heated, and the cooling zone 6 in which the heated circuit board 3 is cooled. The reflow furnace Rf1 configured as above includes the shield 10 disposed between the heat zone 5 and the cooling zone 6 and having the opening 11 for passage of the circuit board 3, and the tunnel-like cover 12 physically coupled to the opening 11 and extending along the transport direction of the circuit board 3.

The soldering method according to First Embodiment includes the heating step S12 in which the circuit board 3 with the mounted electronic component 2 is heated in the heat zone 5, and the cooling step S14 of cooling the circuit board 3 heated in the cooling zone 6. The circuit board 3 after heating is carried into the cooling zone 6 from the heat zone 5 through the tunnel-like cover 12 physically coupled to the opening 11 provided through the shield 10 spatially separating the heat zone 5 and the cooling zone 6 from each other.

As described above, in First Embodiment of the present disclosure, the shield 10 can inhibit movement of the flux particle-containing atmosphere gas from the heat zone 5 to the cooling zone 6 in the furnace. Specifically, the opening 11 provided for passage of the circuit board 3 is physically coupled to the tunnel-like cover 12, and provides only a small area of passage for the circuit board 3. The conductance of the traveling gas also becomes smaller by the provision of the tunnel-like cover 12. In this way, movement of the flux-particle containing atmosphere gas through the opening 11 in the furnace can be inhibited.

As described above, in the reflow furnace lacking the configuration of the present disclosure providing the shield 10 and the tunnel-like cover 12 between the heat zone 5 and the cooling zone 6, the circuit board 3 experiences large temperature changes as it moves from the heat zone 5 to the cooling zone 6 in an atmosphere where the temperature has a temperature distribution represented by the following formula 2. This causes a thermal cracking defect.

(Ambient temperature of heat zone)>(ambient temperature of cooling zone)      Formula 2

In contrast, the configuration of First Embodiment has the relationship of the following formula 3 between the ambient temperature of the heat zone 5, the ambient temperature in the tunnel-like cover 12 on the heat zone 5 side of the shield 10, the ambient temperature in the tunnel-like cover 12 on the cooling zone 6 side of the shield 10, and the ambient temperature of the cooling zone 6.

(Ambient temperature of heat zone)>(ambient temperature in the tunnel-like cover on the heat zone side of the shield)>(ambient temperature in the tunnel-like cover on the cooling zone side of the shield)>(ambient temperature of cooling zone)      Formula 3

With this configuration, the ambient temperature gradually decreases for the circuit board 3 moving into the cooling zone 6 from the heat zone 5, and the circuit board 3 experiences smaller temperature changes, making it possible to reduce the thermal cracking defect in the electronic component 2.

In the First Embodiment of the present disclosure described above, movement of the flux particle-containing atmosphere gas from the heat zone 5 to the cooling zone 6 in the furnace can be inhibited, and the amount of flux clinging to the walls and the ceiling plate surface of the furnace in the cooling zone 6 can be reduced. At the same time, the ambient temperature gradually decreases for the circuit board 3 moving into the cooling zone 6 from the heat zone 5, and the circuit board 3 experiences smaller temperature changes. In this way, the flux clinging defect in the circuit board 3, and the thermal cracking defect in the electronic component 2 can be reduced at the same time.

Second Embodiment

Figure 7:
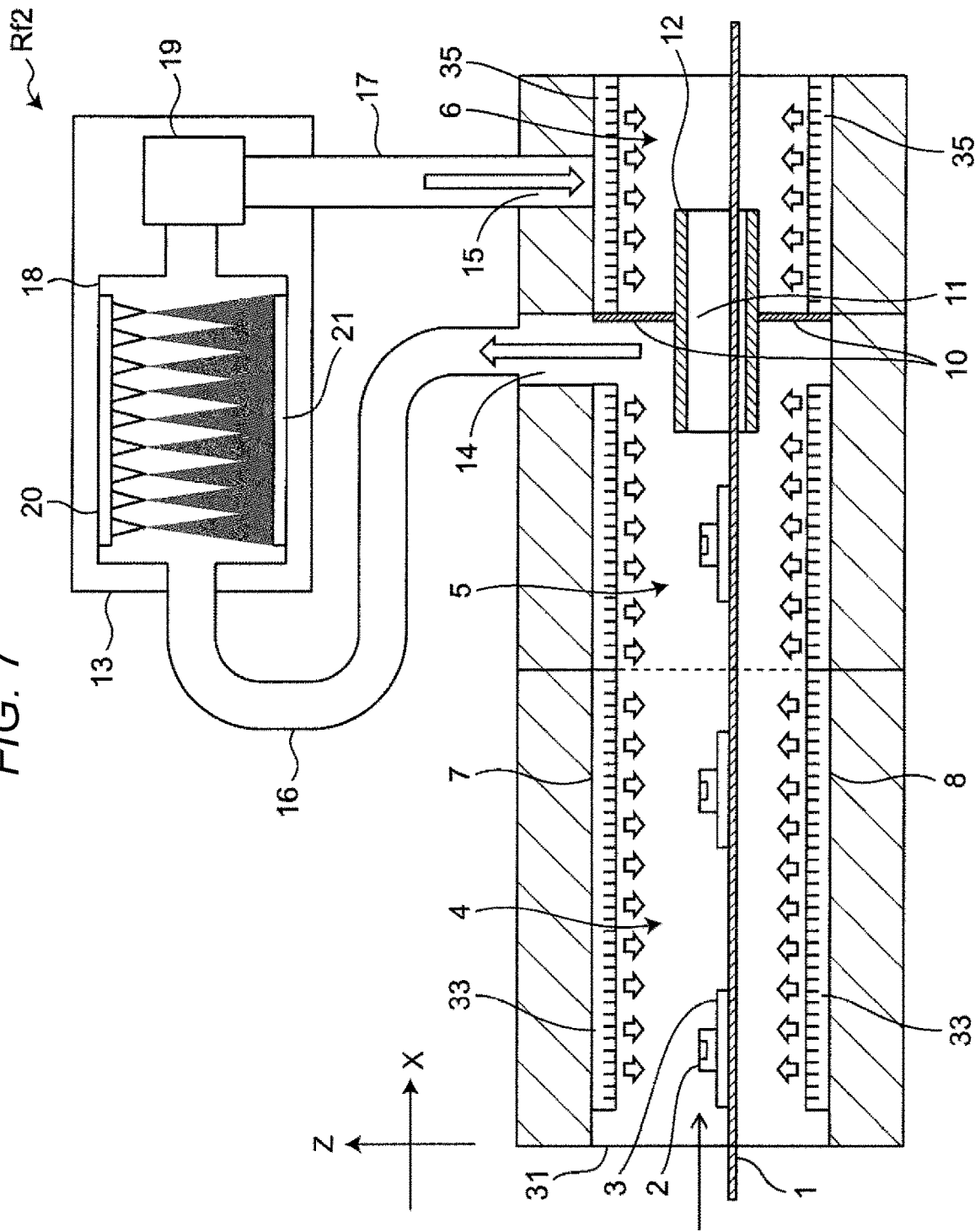
FIG. 7 is a longitudinal sectional view of a reflow furnace of Second Embodiment.
Figure 8:
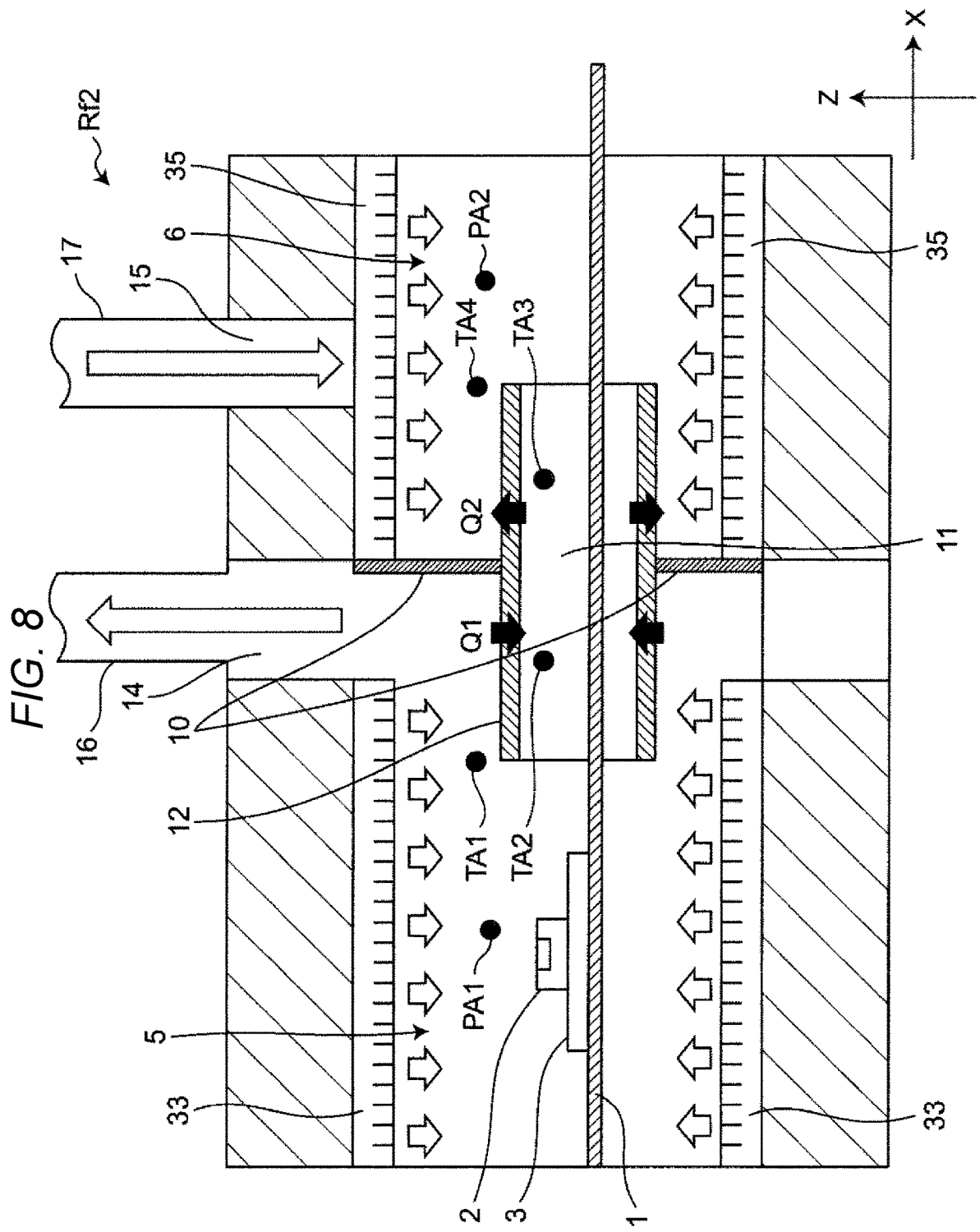
FIG. 8 is a partially enlarged longitudinal sectional view showing areas around a tunnel-like cover shown in FIG. 7.

FIG. 7 is a cross sectional view showing a reflow furnace Rf2 of Second Embodiment of the present disclosure, as viewed on a cross section parallel to the transport direction of the circuit board 3. FIG. 8 is a partially enlarged view of FIG. 7, showing areas around the tunnel-like cover shown in FIG. 7. In FIGS. 7 and 8, the constituting elements described in conjunction with FIGS. 1 to 3 are referred to using the same reference numerals, and will not be described again.

The reflow furnace Rf2 of Second Embodiment of the present disclosure shown in FIG. 7 is provided with an electrostatic-precipitation flux collection apparatus 13, in addition to the configuration described in First Embodiment. The reflow furnace Rf2 has an inlet 14 in the heat zone 5, and an outlet 15 in the cooling zone 6. The intake side of the flux collection apparatus 13 is coupled to the inlet 14 via a suction duct 16, and the outlet side of the flux collection apparatus 13 is coupled to the outlet 15 via a discharge duct 17. The flux particles in the flux particle-containing atmosphere gas generated in the heat zone 5 are collected by the flux collection apparatus 13, and the atmosphere gas is returned to the cooling zone 6. In FIGS. 7 and 8, the inlet 14 is disposed at the downstream end of the heat zone 5. However, this is merely an example, and the inlet 14 may be disposed in any part of the heat zone 5, including the front, middle, and rear portions of the heat zone 5, and the top surface, the bottom surface, and the side surfaces of the heat zone 5. It is, however, recommended that the inlet 14 be disposed in a part of the heat zone 5 where the flux particles in the atmosphere gas have the highest concentration. Likewise, the outlet 15, provided in the middle of the cooling zone 6 in the example shown in FIGS. 7 and 8, may be disposed in any part of the cooling zone 6, including the front, middle, and rear portions of the cooling zone 6, and the top surface, the bottom surface, and the side surfaces of the cooling zone 6, as may be appropriately decided according to the desired cooling rate of the temperature profile.

The flux collection apparatus 13 is configured from a collection box 18 and a fan 19. The collection box 18 has a needle electrode 20 and an earthing electrode 21. The needle electrode 20 and the earthing electrode 21 are disposed flat, parallel to each other. Applying a high voltage between the needle electrode 20 and the earthing electrode 21 generates a corona discharge and a high potential difference. Here, the flux particles become statically charged as the flux particle-containing atmosphere gas drawn by the fan 19 from the reflow furnace Rf2 passes between the needle electrode 20 and the earthing electrode 21. The charged flux particles are attracted toward the earthing electrode 21 in an electric field of a high potential difference, and attach to the earthing electrode 21 for collection.

In First Embodiment, entry of the atmosphere gas into the cooling zone 6 from the heat zone 5 can be reduced more effectively by making the aperture size of the opening 11 and the tunnel-like cover 12 smaller. However, the aperture size must be large enough to allow for passage of the circuit board 3 with the mounted electronic component 2. There are cases where the opening 11 cannot be made small enough to reduce conductance, such as when the electronic component 2 on the circuit board 3 is tall. The configuration of Second Embodiment of the present disclosure can deal with such cases by collecting the flux particles from the flux particle-containing atmosphere gas drawn into the flux collection apparatus 13 through the inlet 14, and returning the atmosphere gas to the cooling zone 6 through the outlet 15, in addition to blocking the movement of the flux particle-containing atmosphere gas from the heat zone 5, where the flux particle-containing atmosphere gas is generated, to the cooling zone 6, using the shield 10.

In this way, the amount of flux particles contained in the atmosphere gas in the heat zone 5 can be minimized, and clinging of the flux to the walls and the ceiling plate surface of the furnace in the cooling zone 6 can be inhibited even when entry of the atmosphere gas to the cooling zone 6 from the heat zone 5 through the opening 11 and the tunnel-like cover 12 occurs in situations where the opening 11 cannot be made small enough to reduce conductance.

Because the atmosphere gas drawn into the flux collection apparatus 13 from the reflow furnace Rf2 returns to the cooling zone 6, the pressure PA2 inside the cooling zone 6 becomes higher than the pressure PA1 inside the heat zone 5 (FIG. 8), as represented by the following formula 4.

$$PA1 < PA2 \quad \text{Formula 4}$$

This creates a pressure difference across the opening 11 and the tunnel-like cover 12, and the movement of the flux particle-containing atmosphere gas from the heat zone 5 to the cooling zone 6 can be inhibited.

When, for example, the flux collection apparatus 13 is a flux collection apparatus that operates under a common cooling scheme, the flux particle-containing atmosphere gas is cooled by a radiator or the like provided in the flux collection apparatus. That is, the flux particles are condensed in the flux collection apparatus for collection. Accordingly, the atmosphere gas that returns into the cooling zone 6 through the outlet 15 via the discharge duct 17 is very cool.

In contrast, the flux collection apparatus according to the configuration of Second Embodiment of the present disclosure is an electrostatic-precipitation flux collection apparatus 13. The electrostatic-precipitation flux collection apparatus 13 is structured to collect the flux particles using the corona discharge and the high potential difference generated in the collection box 18, as described above. That is, the apparatus does not use an active cooling structure but instead allows the atmosphere gas to naturally cool by means of natural dissipation. In this way, the atmosphere gas drawn out of the heat zone 5 can return to the cooling zone 6 without any temperature drop other than a loss caused by natural dissipation.

Figure 9:
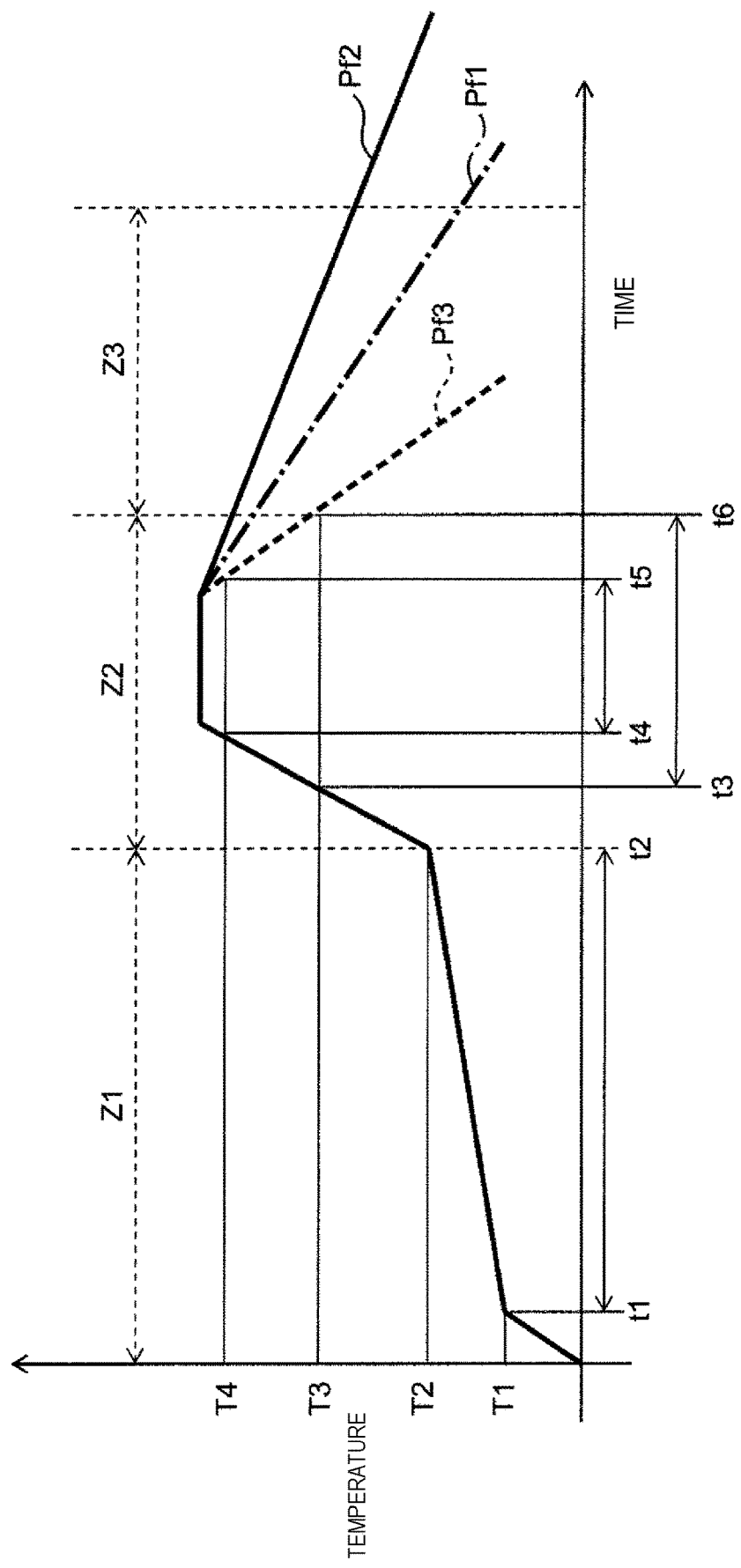
FIG. 9 shows a graph representing the temperature profile of the reflow furnace of Second Embodiment.

FIG. 9 shows a temperature profile Pf2 based on Second Embodiment of the present disclosure, a temperature profile Pf1 based on First Embodiment of the present disclosure, and a temperature profile Pf3 based on a reflow furnace lacking the configuration of the present disclosure providing the shield 10 and the tunnel-like cover 12 between the heat zone 5 and the cooling zone 6. In a part of the graph representing the cooling rate in the cooling zone 6, the temperature profile Pf2 based on Second Embodiment of the present disclosure is indicated by solid line, the temperature profile Pf1 based on First Embodiment of the present disclosure is indicated by dashed-dotted line, and the temperature profile Pf3 representing the cooling rate in the reflow furnace lacking the configuration of the present disclosure providing the shield 10 and the tunnel-like cover 12 between the heat zone 5 and the cooling zone 6 is indicated by dotted line. In FIG. 9, the elements described in conjunction with FIGS. 5 and 13 are referred to using the same reference numerals, and will not be described again.

In Second Embodiment of the present disclosure, the ambient temperature TP4 of the cooling zone 6 can be made higher than the ambient temperature TP4 of the cooling zone 6 of First Embodiment while still satisfying the temperature relationship represented by the formula 1 above. Accordingly, the ambient temperature TP3 in the tunnel-like cover 12 on the cooling zone 6 side of the shield 10 also can be higher than the ambient temperature TP3 in the tunnel-like cover 12 on the cooling zone 6 side of the shield 10 achieved in First Embodiment.

In this way, the circuit board 3 experiences even smaller temperature changes than in the configuration of First Embodiment.

As indicated by solid line in FIG. 9, the temperature profile Pf2 representing the cooling rate has a slope that is even more gradual than that achievable with the configuration of First Embodiment of the present disclosure, and rapid cooling of the circuit board 3 can be prevented. By disposing the inlet 14 above the tunnel-like cover 12 in a position on the transport direction of the circuit board 3, the flux particles can be received by the tunnel-like cover 12 even when a mass of flux particles clinging to the inlet 14 falls off. In this way, clinging of the flux to the circuit board 3 can be prevented.

Figure 10:
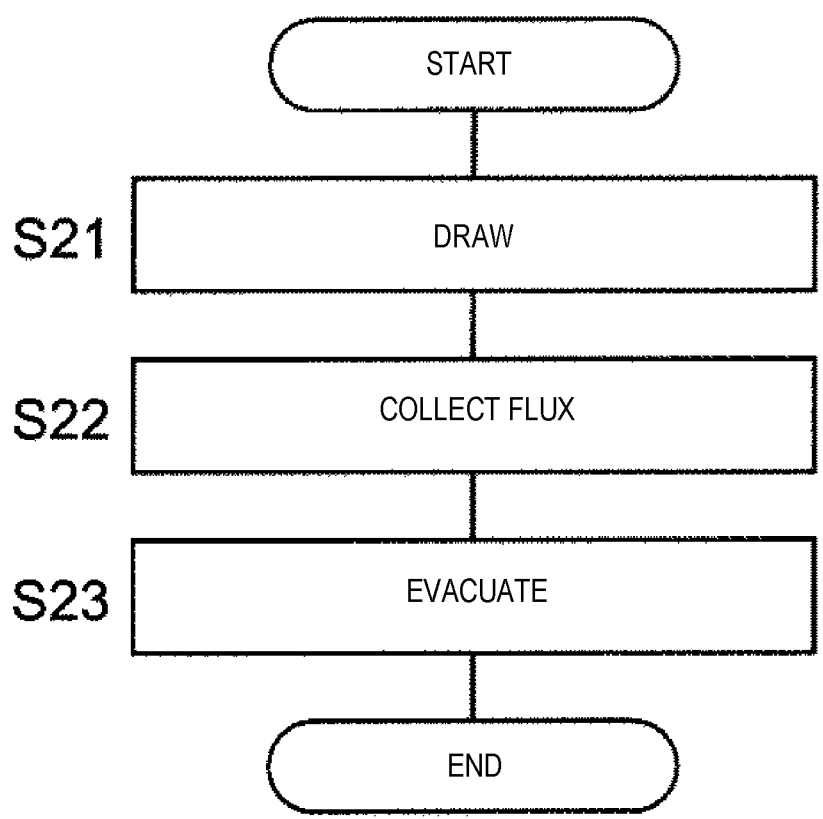
FIG. 10 is a flowchart representing a flux collection procedure.

FIG. 10 is a flowchart representing a flux collection procedure according to Second Embodiment. In step S21, the atmosphere gas is drawn out of the heat zone 5 by the fan 19. The atmosphere gas in the heat zone 5 is drawn into the collection box 18 of the flux collection apparatus 13 through the inlet 14, via the suction duct 16. In step S22, the flux contained in the drawn atmosphere gas is collected in the electrostatic-precipitation collection box 18. In step S23, the atmosphere gas after flux collection returns to the cooling zone 6. After flux collection, the fan 19 forces the atmosphere gas into the cooling zone 6 from the collection box 18 through the discharge duct 17.

In Second Embodiment of the present disclosure described above, the atmosphere gas in the reflow furnace Rf2 can be drawn out of the reflow furnace Rf2 through the inlet 14, and discharged through the outlet 15 to create a pressure difference across the tunnel-like cover 12, even when the opening 11 cannot be made small enough to reduce conductance, such as when the electronic component 2 on the circuit board 3 is tall. In this way, the movement of the flux particle-containing atmosphere gas from the heat zone 5 to the cooling zone 6 in the reflow furnace Rf2 can be greatly inhibited. This makes it possible to greatly reduce the amount of flux clinging to the walls and the ceiling plate surface of the furnace in the cooling zone 6. At the same time, the ambient temperature gradually decreases for the circuit board 3 moving into the cooling zone 6 from the heat zone 5, and the circuit board 3 experiences smaller temperature changes. In this way, the flux clinging defect in the circuit board 3, and the thermal cracking defect in the electronic component 2 can be reduced at the same time.

Third Embodiment

Figure 11:
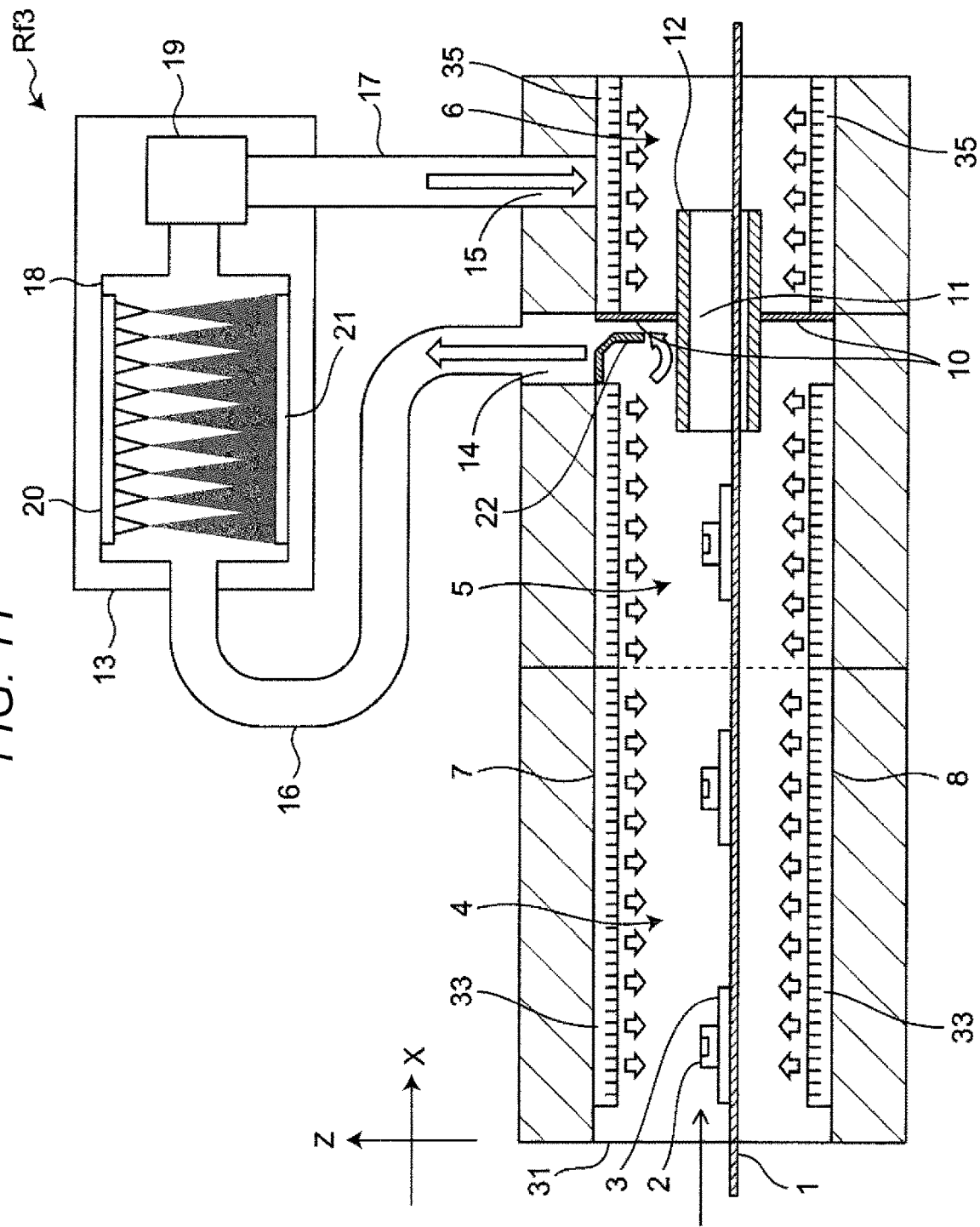
FIG. 11 is a longitudinal sectional view of a reflow furnace of Third Embodiment.

FIG. 11 is a cross sectional view showing a reflow furnace Rf3 of Third Embodiment the present disclosure, as viewed on a cross section parallel to the transport direction of the circuit board 3. In FIG. 11, the constituting elements described in conjunction with FIGS. 1, 2, 7 and 8 are referred to using the same reference numerals, and will not be described again.

The reflow furnace of Third Embodiment of the present disclosure shown in FIG. 11 includes a second shield 22 at the inlet 14, in addition to the configuration described in Second Embodiment. The second shield 22 extends toward the top cover above the transport path of the circuit board 3. Horizontally, the second shield 22 extends to the side surfaces of the furnace. With the shield 10, the second shield 22 at the inlet 14 functions as a slit-like suction nozzle over a width direction perpendicular to the transport direction of the circuit board 3 in the furnace.

Desirably, the inlet 14 provided in the heat zone 5 should evenly draw the atmosphere gas in the heat zone 5 over a width direction perpendicular to the transport direction of the circuit board 3 in the furnace. This is because the flux particle-containing atmosphere gas is uniformly filling the furnace in the heat zone 5. However, the inlet 14 is normally a round hole of a diameter ϕ in a range of about 50 mm to 100 mm, disposed in the top surface, the bottom surface, or a side surface of the furnace.

Here, the flux particle-containing atmosphere gas drawn out of the heat zone 5 is only a portion of the atmosphere gas in the heat zone 5 around the inlet 14. In this case, only flux particles in certain areas of the heat zone 5 over a width direction perpendicular to the transport direction of the circuit board 3 in the furnace can be collected when the concentration of the flux particle-containing atmosphere gas in the reflow furnace is unusually high, and the flux particle-containing atmosphere gas in other areas of the heat zone 5 may enter the opening 11 and the tunnel-like cover 12. Because the atmosphere gas is drawn only from areas around the inlet 14, a pressure drop occurs only in areas of the heat zone 5 around the inlet 14 in a width direction perpendicular to the transport direction of the circuit board 3 in the furnace, with the result that the pressure relationship represented by formula 4 does not hold in other areas of the heat zone 5. This may result in the flux particle-containing atmosphere gas entering the opening 11 and the tunnel-like cover 12.

In the configuration of Third Embodiment of the present disclosure, the slit-like suction nozzle configured from the shield 10 and the second shield 22 is disposed over a width direction perpendicular to the transport direction of the circuit board 3 in the furnace, and the flux particle-containing atmosphere gas can be uniformly drawn out of the heat zone 5 over a width direction perpendicular to the transport direction of the circuit board 3 in the furnace. Accordingly, in the drawing step S21, the atmosphere gas is drawn over a width direction perpendicular to the transport direction of the circuit board 3.

In this way, a pressure drop evenly occurs in a width direction perpendicular to the transport direction of the circuit board 3 in the furnace. This enables collection of flux particles over a width direction perpendicular to the transport direction (X direction) of the circuit board 3 in the furnace when the concentration of the flux particle-containing atmosphere gas in the reflow furnace Rf3 is unusually high. Because the pressure relationship represented by formula 4 can hold for a width direction (Y direction) perpendicular to the transport direction of the circuit board 3 in the furnace, the flux clinging reducing effect can be obtained regardless of, for example, the position and the size of the inlet 14.

In Third Embodiment of the present disclosure, the shield 10 is used to form the slit-like nozzle over a width direction perpendicular to the transport direction of the circuit board 3 in the furnace. However, this is merely an example, and the slit-like nozzle may be formed at the inlet 14 without using the shield 10, provided that the slit-like nozzle is positioned at least on the upstream side of the shield 10 in the heat zone 5. In this case, it is recommended that the slit-like nozzle be disposed in a part of the heat zone 5 where the flux particles in the atmosphere gas have the highest concentration.

The present disclosure is not limited to the embodiments described above, and may be modified as follows.

In the foregoing embodiments, the tunnel-like cover 12 extends in both directions, forward and reverse, along the transport direction of the circuit board 3 toward the heat zone 5 and the cooling zone 6 on both sides of the opening 11. However, the present disclosure is not limited to this, and the tunnel-like cover 12 may extend on one side of the opening 11 toward the heat zone 5, opposite from the transport direction of the circuit board 3, or may extend only toward the cooling zone 6 side of the opening 11 in the transport direction of the circuit board 3.

INDUSTRIAL APPLICABILITY

With the reflow furnaces of the embodiments of the present disclosure, the movement of the flux particle-containing atmosphere gas from the heat zone to the cooling zone in the furnace can be inhibited to reduce the amount of flux clinging to the walls and the ceiling plate surface of the furnace in the cooling zone, and, at the same time, to create an ambient temperature that gradually decreases for the circuit board moving into the cooling zone from the heat zone. In this way, the circuit board experiences smaller temperature changes, and the flux clinging defect in the circuit board, and the thermal cracking defect in the electronic component can be reduced at the same time. This makes it possible to reduce defects in products made by mounting a heat intolerant component on a circuit board in a reflow furnace.

What is claimed is:

1. A reflow furnace that has a heat zone in which a circuit board with a mounted electronic component is heated, and a cooling zone in which the heated circuit board is cooled, the reflow furnace comprising:
 a shield disposed between the heat zone and the cooling zone and having an opening for passage of the circuit board;
 a tunnel-like cover coupled to the opening and extending along a transport direction of the circuit board; and
 an electrostatic-precipitation flux collection apparatus that includes a drawing unit that draws an atmosphere gas out of the reflow furnace in the heat zone, and a flux collection unit that collects a flux contained in the atmosphere gas,
 wherein the flux collection apparatus returns the gas to the cooling zone after collecting the flux.

2. The reflow furnace according to claim 1, wherein the drawing unit has a slit-like suction nozzle disposed over a width direction perpendicular to the transport direction of the circuit board in the reflow furnace.

3. The reflow furnace according to claim 1, which satisfies TP1>TP2>TP3>TP4, where TP1 is an ambient temperature of the heat zone, TP2 is a temperature inside the tunnel-like cover on the heat zone side of the shield, TP3 is a temperature inside the tunnel-like cover on the cooling zone side of the shield, and TP4 is an ambient temperature of the cooling zone.

4. The reflow furnace according to claim 1, which satisfies PA1<PA2, where PA1 is a pressure in the heat zone, and PA2 is a pressure in the cooling zone.

5. The reflow furnace according to claim 2, which satisfies PA1<PA2 over the width direction perpendicular to the transport direction of the circuit board in the reflow furnace, where PA1 is a pressure in the heat zone, and PA2 is a pressure in the cooling zone.

6. A soldering method comprising:
heating an electronic component-mounted circuit board in a heat zone; and
cooling the heated circuit board in a cooling zone;
drawing an atmosphere gas from the heat zone;
collecting a flux contained in the atmosphere gas by means of electrostatic precipitation; and
returning the atmosphere gas to the cooling zone after the collection of the flux,
wherein the heat zone and the cooling zone are spatially separated from each other by a shield having an opening, and
wherein the heated circuit board is carried into the cooling zone from the heat zone through a tunnel-like cover physically coupled to the opening.

7. The method according to claim 6, wherein, the drawing further includes drawing the atmosphere gas over a width direction perpendicular to a transport direction of the circuit board.

8. The method according to claim 6, which satisfies TP1>TP2>TP3>TP4, where TP1 is an ambient temperature of the heat zone, TP2 is a temperature inside the tunnel-like cover on the heat zone side of the shield, TP3 is a temperature inside the tunnel-like cover on the cooling zone side of the shield, and TP4 is an ambient temperature of the cooling zone.

9. The method according to claim 6, which satisfies PA1<PA2, where PA1 is a pressure in the heat zone, and PA2 is a pressure in the cooling zone.

10. The method according to claim 7, which satisfies PA1<PA2 over the width direction perpendicular to the transport direction of the circuit board in the furnace, where PA1 is a pressure in the heat zone, and PA2 is a pressure in the cooling zone.

11. The reflow furnace according to claim 1, wherein the tunnel-like cover is solid and has a shape of a hollow rectangular column.

12. The reflow furnace according to claim 1, wherein the tunnel-like cover is solid, and has a shape of a hollow rectangular, circular, or arc-shaped cover with an open bottom.

13. The method according to claim 6, wherein the tunnel-like cover is solid and has a shape of a hollow rectangular column.

14. The method according to claim 6, wherein the tunnel-like cover is solid, and has a shape of a hollow rectangular, circular, or arc-shaped cover with an open bottom.

15. The reflow furnace according to claim 1, wherein the tunnel-like cover is physically coupled to the opening.

16. The reflow furnace according to claim 1, wherein the tunnel-like cover extends to the cooling zone.

17. The method according to claim 6, wherein the tunnel-like cover extends to the cooling zone.

* * * * *